(12) United States Patent
Horii

(10) Patent No.: US 12,136,652 B2
(45) Date of Patent: Nov. 5, 2024

(54) SEMICONDUCTOR DEVICE

(71) Applicant: SUMITOMO ELECTRIC INDUSTRIES, LTD., Osaka (JP)

(72) Inventor: Taku Horii, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 422 days.

(21) Appl. No.: 17/595,457

(22) PCT Filed: May 22, 2020

(86) PCT No.: PCT/JP2020/020321
§ 371 (c)(1),
(2) Date: Nov. 17, 2021

(87) PCT Pub. No.: WO2021/005896
PCT Pub. Date: Apr. 14, 2021

(65) Prior Publication Data
US 2022/0199778 A1    Jun. 23, 2022

(30) Foreign Application Priority Data

Jul. 10, 2019 (JP) .................................. 2019-128619

(51) Int. Cl.
*H01L 29/16* (2006.01)
*H01L 21/28* (2006.01)
*H01L 23/00* (2006.01)
*H01L 29/423* (2006.01)
*H01L 29/49* (2006.01)
*H01L 29/78* (2006.01)

(52) U.S. Cl.
CPC .... *H01L 29/1608* (2013.01); *H01L 21/28017* (2013.01); *H01L 24/05* (2013.01); *H01L 24/29* (2013.01); *H01L 29/42364* (2013.01); *H01L 29/49* (2013.01); *H01L 29/78* (2013.01); *H01L 2224/05099* (2013.01); *H01L 2224/29099* (2013.01)

(58) Field of Classification Search
None
See application file for complete search history.

(56) References Cited

U.S. PATENT DOCUMENTS

2018/0097070 A1    4/2018  Miura et al.
2019/0288082 A1*   9/2019  Sagawa ............... H01L 29/7803

FOREIGN PATENT DOCUMENTS

| JP | H02-117145 | 5/1990 |
| JP | 2018-056506 | 4/2018 |
| WO | 2017/029748 | 2/2017 |

* cited by examiner

*Primary Examiner* — Robert K Carpenter
(74) *Attorney, Agent, or Firm* — IPUSA, PLLC

(57) ABSTRACT

A semiconductor device includes a semiconductor substrate, a gate insulator provided on a surface of the semiconductor substrate, a bonding film, including silicon or aluminum, provided on the gate insulator, and a gate pad layer provided above the bonding film, wherein the gate pad layer includes titanium in at least a region in contact with the bonding film.

18 Claims, 22 Drawing Sheets

SEMICONDUCTOR DEVICE

TECHNICAL FIELD

The present disclosure relates to semiconductor devices.

This application is based upon and claims priority to Japanese Patent Application No. 2019-128619 filed on Jul. 10, 2019, the entire contents of which are incorporated herein by reference.

BACKGROUND ART

In a semiconductor device, such as a field effect transistor or the like, a gate electrode and a source electrode are formed on one surface of a semiconductor substrate, a drain electrode or the like are formed on the other surface of the semiconductor substrate, and a gate pad connected to the gate electrode or the like is connected to an external terminal by a wire bonding. In such a semiconductor device, because delamination of the gate pad may occur during the wire bonding of the gate pad, a method has been proposed to form the gate pad on a surface of an insulating film having irregularities formed thereon, in order to prevent the delamination of the gate pad.

PRIOR ART DOCUMENTS

Patent Documents

Patent Document 1: Japanese Laid-Open Patent Publication No. H02-117145

DISCLOSURE OF THE INVENTION

A semiconductor device according to the present disclosure includes a semiconductor substrate; a gate insulator provided on a surface of the semiconductor substrate; a bonding film, including silicon or aluminum, provided on the gate insulator; and a gate pad layer provided above the bonding film, wherein the gate pad layer includes titanium in at least a region in contact with the bonding film.

MODE OF CARRYING OUT THE INVENTION

Figure 1:
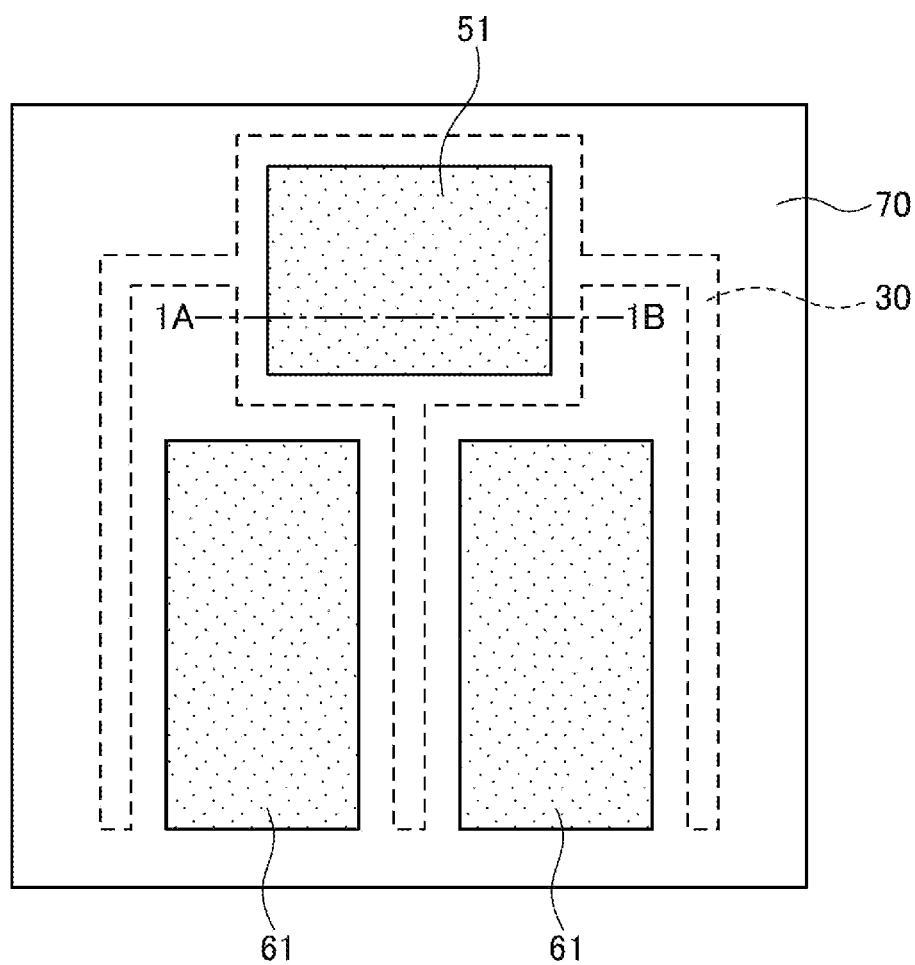
FIG. 1 is a top view of a silicon carbide semiconductor device.

Problem to be Solved by the Present Disclosure

In the case of a structure in which a gate pad is simply formed on a surface of an insulating film having irregularities famed thereon, the adhesion of the gate pad is insufficient, and it is not always possible to sufficiently prevent delamination of the gate pad during a wire bonding of the gate pad. For this reason, there are demands for a semiconductor device having the gate pad with a high adhesion.

Effects of the Present Disclosure

According to the present disclosure, it is possible to improve an adhesion of a gate pad in a semiconductor device.

Embodiments for carrying out the present disclosure will be described below.

DESCRIPTION OF EMBODIMENTS OF THE PRESENT DISCLOSURE

First, embodiments of the present disclosure will be described, with reference to examples. In the following description, the same or corresponding elements are designated by the same reference numerals, and a description of the same or corresponding elements will not be repeated.

[1] A semiconductor device according to one aspect of the present disclosure includes a semiconductor substrate; a gate insulator provided on a surface of the semiconductor substrate; a bonding film, including silicon or aluminum, provided on the gate insulator; and a gate pad layer provided above the bonding film, wherein the gate pad layer includes titanium in at least a region in contact with the bonding film.

In this case, it is possible to improve the adhesion of the gate pad, and prevent delamination of the gate pad during a wire bonding of the gate pad.

[2] A plurality of convex portions may be formed of an insulator and provided on the gate insulator, and the bonding film may be provided between adjacent convex portions of the plurality of convex portions.

In this case, it is possible to further improves the adhesion of the gate pad.

[3] The bonding film may have one of a stripe shape, a circular shape, and a polygonal shape in a top view.

The above described shape can improve the adhesion of the gate pad.

[4] A spacing between adjacent bonding films may be in a range greater than or equal to 0.5 µm and less than or equal to 100 µm.

From a viewpoint of an accuracy of finishing of the general photolithography, the spacing is preferably greater than or equal to 0.5 µm, and from a viewpoint of securing an anchor effect, the spacing is preferably less than or equal to 100 µm.

[5] A passivation film may be provided on the gate pad layer, a gate pad region may be famed by a region of the gate pad layer exposed via an opening in the passivation film, and an area of the bonding film with respect to an area of the gate pad region may be in a range greater than or equal to 5% and less than or equal to 95%.

This is because the effect of improving the adhesion is small if the area of the bonding film is less than 5%, the anchor effect is small if the area is greater than 95%.

[6] A passivation film may be provided on the gate pad layer, a gate pad region may be famed by a region of the gate pad layer exposed via an opening in the passivation film, and the bonding film and the gate pad layer may be in contact with each other within the entire gate pad region.

This is because the adhesion can be improved even if the bonding film makes contact with the gate pad layer within the entire gate pad region.

[7] The gate pad layer may include an alloy layer including titanium, a titanium nitride layer, and a metal layer including aluminum which are successively laminated from a side in contact with the bonding film.

By making the metal layer have such a structure, the alloy layer including the material forming the bonding layer can be formed, to improve the adhesion.

[8] The semiconductor substrate may be a silicon carbide semiconductor substrate.

The present disclosure is useful when applied to semiconductor devices using silicon carbide semiconductor substrates.

[9] A semiconductor device according to another aspect of the present disclosure includes a semiconductor substrate; a gate insulator provided on a surface of the semiconductor substrate; a bonding film provided on the gate insulator and including silicon or aluminum; and a gate pad layer provided on the bonding film, wherein the gate pad layer includes titanium in at least a region making contact with the bonding film, a plurality of convex portions made of an insulator are provided on the gate insulator, the bonding film is provided between adjacent convex portions of the plurality of convex portions, the bonding film has one of a stripe shape, a circular shape, and a polygonal shape in a top view, a spacing between adjacent bonding films is in a range greater than or equal to 0.5 µm and less than or equal to 100 µm, a passivation film is provided on the gate pad layer, a gate pad region is formed by a region of the gate pad layer exposed via an opening in the passivation film, and an area of the bonding film with respect to an area of the gate pad region is in a range greater than or equal to 5% and less than or equal to 95%.

[10] A semiconductor device according to still another aspect of the present disclosure includes a silicon carbide semiconductor substrate; a gate insulator provided on a surface of the silicon carbide semiconductor substrate; a bonding film provided on the gate insulator and including silicon or aluminum; and a gate pad layer provided on the bonding film, wherein the gate pad layer includes titanium in at least a region making contact with the bonding film, a plurality of convex portions made of an insulator are provided on the gate insulator, the bonding film is provided between adjacent convex portions of the plurality of convex portions, the bonding film has one of a stripe shape, a circular shape, and a polygonal shape in a top view, a spacing between adjacent bonding films is in a range greater than or equal to 0.5 µm and less than or equal to 100 µm, a passivation film is provided on the gate pad layer, a gate pad region is famed by a region of the gate pad layer exposed via an opening in the passivation film, an area of the bonding film with respect to an area of the gate pad region is in a range greater than or equal to 5% and less than or equal to 95%, and the gate pad layer includes an alloy layer including titanium, a titanium nitride layer, and a metal layer including aluminum which are successively laminated from a side in contact with the bonding film.

DETAILS OF EMBODIMENTS OF THE PRESENT DISCLOSURE

Although embodiments (hereinafter referred to as "present embodiment") of the present disclosure will now be described in detail, the present disclosure is not limited thereto.

First Embodiment

Figure 2:
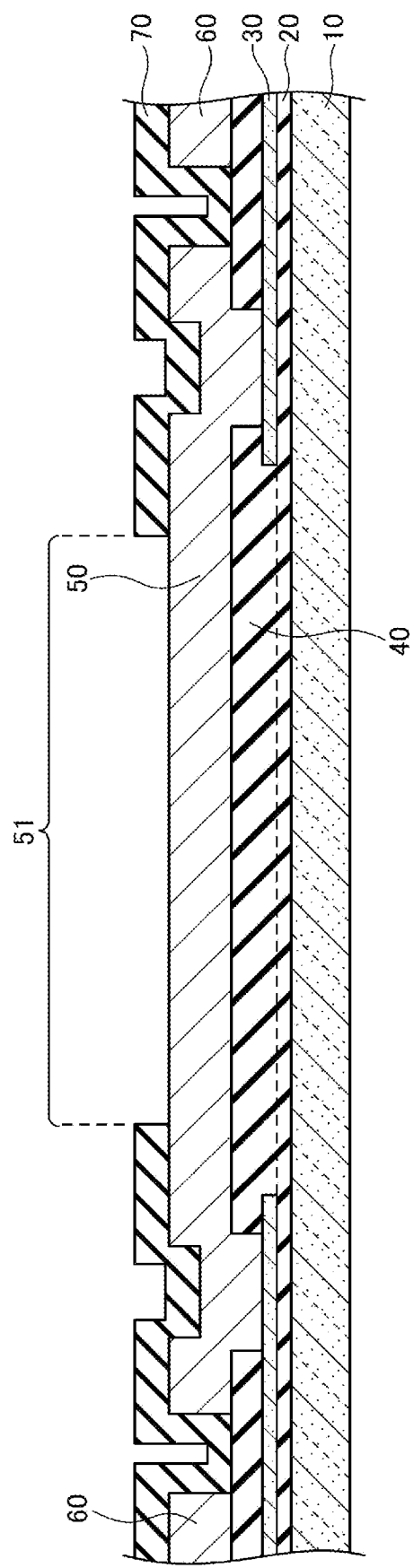
FIG. 2 is a cross sectional view of the silicon carbide semiconductor device.

First, a gate pad or the like of a transistor, which is a silicon carbide semiconductor device, will be described with reference to FIG. 1 and FIG. 2. FIG. 1 is a top view of the silicon carbide semiconductor device, and FIG. 2 is a cross sectional view cut along a one-dot chain line 1A-1B in FIG. 1.

The silicon carbide semiconductor device is a so-called vertical silicon carbide semiconductor device, and includes a gate insulator 20 formed on a silicon carbide semiconductor substrate 10, a gate interconnect layer 30 formed on the gate insulator 20, and an interlayer insulator 40 further formed on the gate insulator 20. The interlayer insulator 40 is also formed on the gate interconnect layer 30, and has an opening at a portion where the gate interconnect layer 30 and the gate pad layer 50 are connected, and a gate pad layer 50 is connected to the gate interconnect layer 30 via the opening in the interlayer insulator 40. The gate pad layer 50 is formed on the interlayer insulator 40 in a region including a gate pad region 51, and a source electrode layer 60 is formed on both sides of the gate pad layer 50.

Further, a passivation film 70 is formed on the gate pad layer 50 and the source electrode layer 60. In the gate pad region 51, the passivation film 70 on the gate pad layer 50 is open, thereby exposing the gate pad layer 50. Moreover, in a source pad region 61 illustrated in FIG. 1, the passivation film 70 on the source electrode layer 60 is open, thereby exposing the source electrode layer 60.

The gate insulator 20 and the interlayer insulator 40 are formed of silicon oxide ($SiO_2$), the gate interconnect layer 30 is formed of polysilicon, and the gate pad layer 50 and the source electrode layer 60 are formed of a metal including Al, Cu, or the like. The passivation film 70 is formed of silicon nitride (SiN) or the like.

In the silicon carbide semiconductor device having a structure described above, delamination of the gate pad layer 50 from an interface with the interlayer insulator 40 may occur when wire bonding to the gate pad region 51. For this reason, there are demands for a silicon carbide semiconductor device having a structure in which delamination of the gate pad layer 50 is unlikely to occur.

(Silicon Carbide Semiconductor Device)

Figure 3:
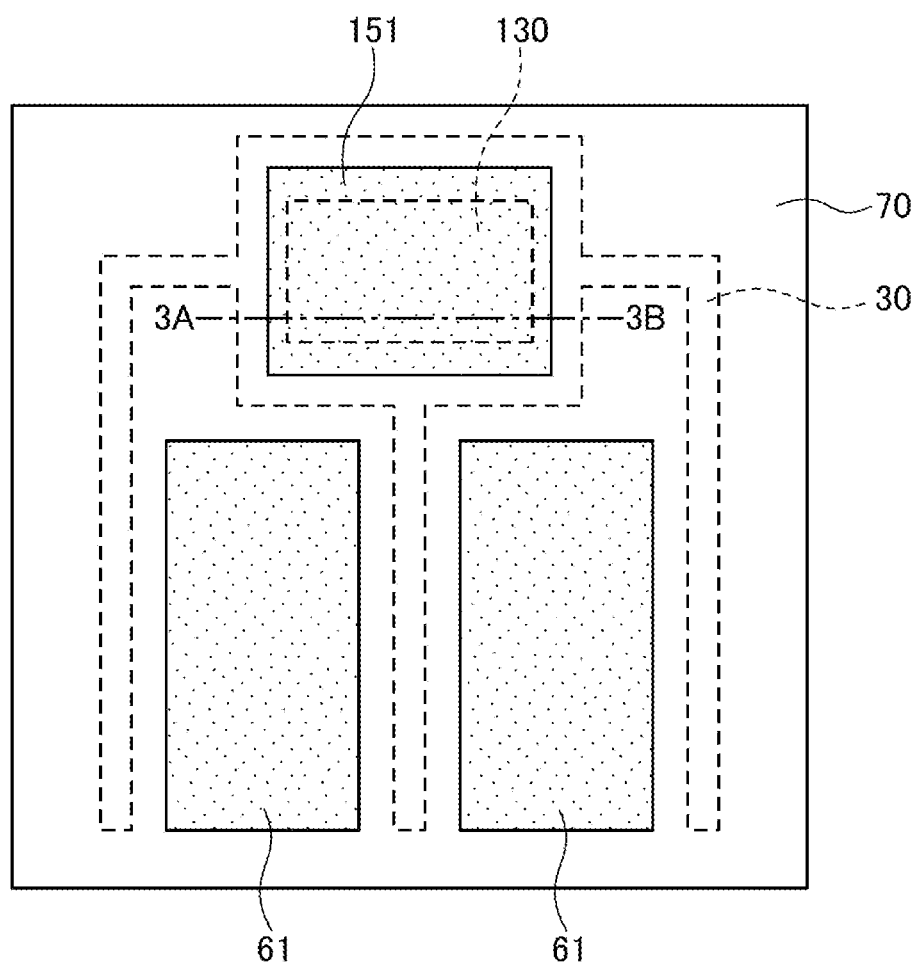
FIG. 3 is a top view of a silicon carbide semiconductor device according to a first embodiment of the present disclosure.
Figure 4:
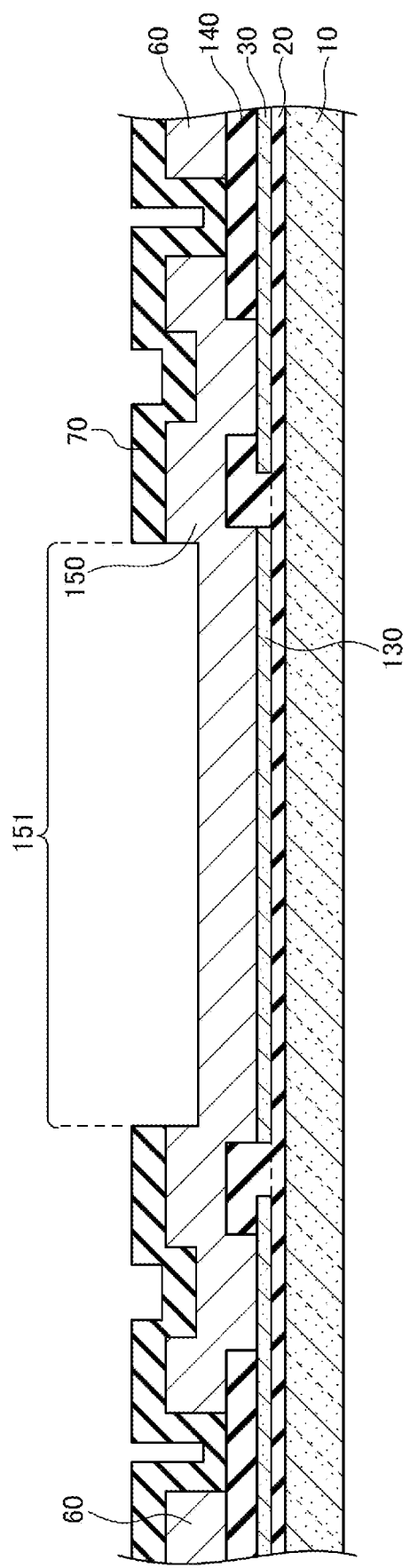
FIG. 4 is a cross sectional view of the silicon carbide semiconductor device according to the first embodiment of the present disclosure.

Next, the silicon carbide semiconductor device, which becomes the vertical transistor according to a first embodiment, will be described with reference to FIG. 3 and FIG. 4. FIG. 3 is a top view of the silicon carbide semiconductor device according to the present embodiment, and FIG. 4 is a cross sectional view cut along a one-dot chain line 3A-3B in FIG. 3.

Because silicon carbide has a wider band gap than silicon which is conventionally used popularly in semiconductor devices, silicon carbide is used in high-voltage semiconductor devices. In the vertical transistor, which is a semiconductor device using silicon carbide, from a viewpoint of a withstand voltage or the like, the gate electrode and the source electrode are formed on a first principal surface of the silicon carbide semiconductor substrate, and the drain electrode is famed on a second principal surface of the silicon carbide semiconductor substrate.

The silicon carbide semiconductor device according to the present embodiment is the so-called vertical silicon carbide semiconductor device, and includes the gate insulator 20 formed on the silicon carbide semiconductor substrate 10, and the gate interconnect layer 30 and a bonding film 130 formed on the gate insulator 20. The gate interconnect layer 30 and the bonding film 130 are separated from each other, and an interlayer insulator 140 is famed on the gate insulator 20 between the gate interconnect layer 30 and the bonding film 130. The interlayer insulator 140 has an opening at a portion where the gate interconnect layer 30 and a gate pad layer 150 are connected, and the gate pad layer 150 is connected to the gate interconnect layer 30 via the opening of the interlayer insulator 140. In addition, the gate pad layer 150 is formed on the bonding film 130 in a region including a gate pad region 151, and the source electrode layer 60 is formed on both sides of the gate pad layer 150.

Moreover, the passivation film 70 is formed on the gate pad layer 150 and the source electrode layer 60. In the gate pad region 151, the passivation film 70 on the gate pad layer 150 is open, thereby exposing the gate pad layer 50. In the source pad region 61 illustrated in FIG. 3, the passivation film 70 on the source electrode layer 60 is open, thereby exposing the source electrode layer 60.

Figure 5:
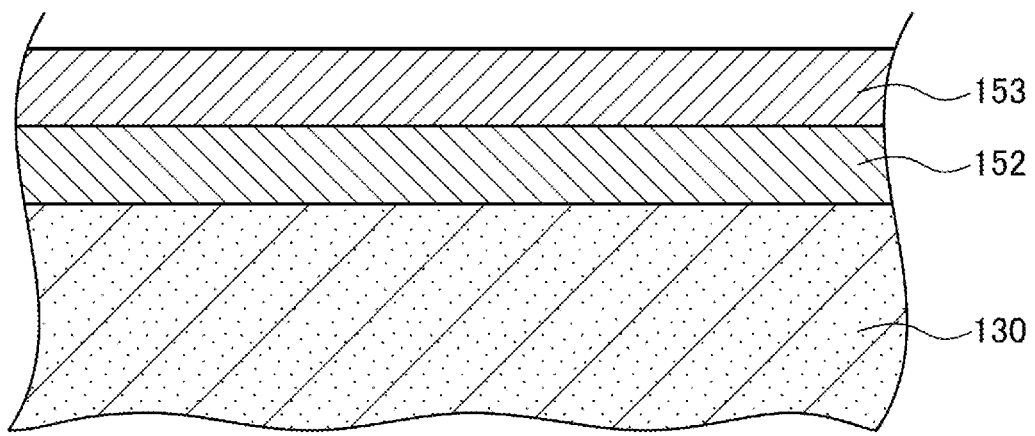
FIG. 5 is a diagram for explaining a structure of the silicon carbide semiconductor device according to the first embodiment of the present disclosure.
Figure 6:
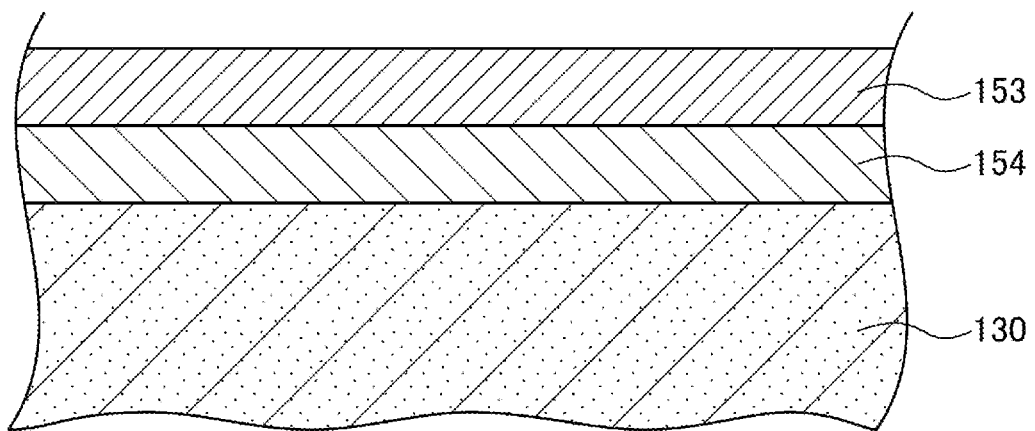
FIG. 6 is a diagram (1) for explaining a gate pad layer according to the first embodiment of the present disclosure.
Figure 7:
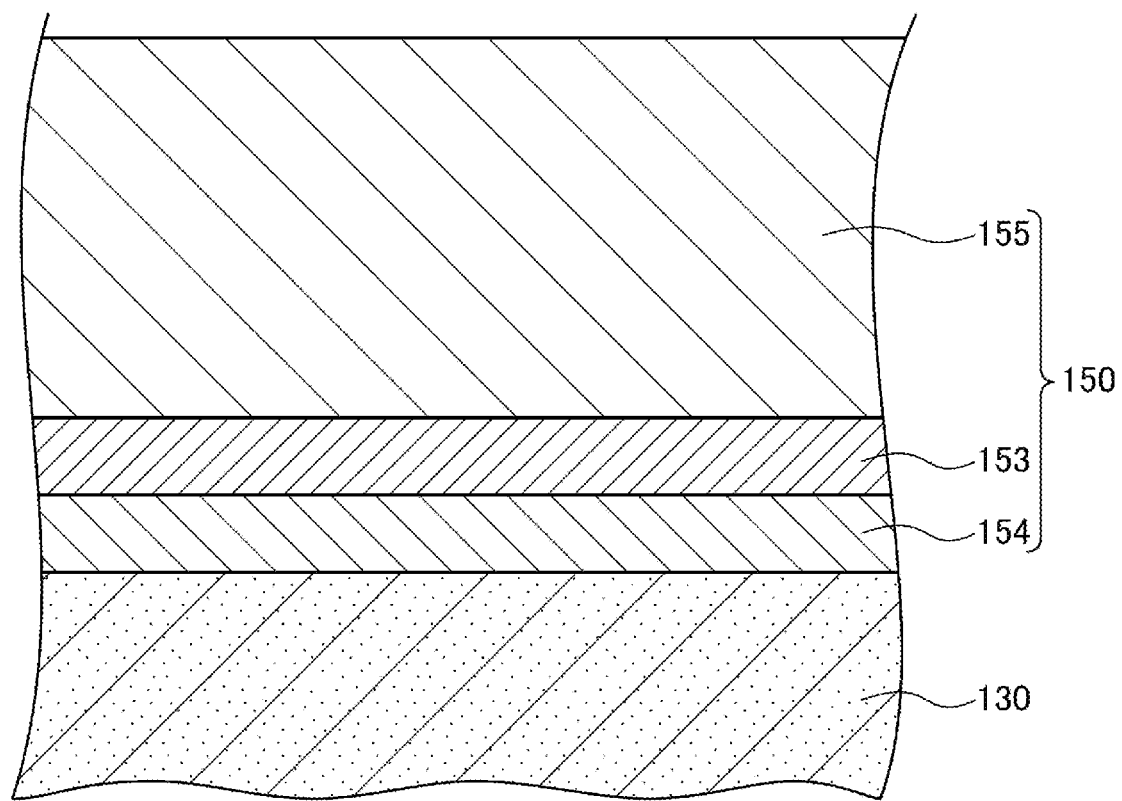
FIG. 7 is a diagram (1) for explaining the gate pad layer according to the first embodiment of the present disclosure.

The interlayer insulator 140 is famed of silicon oxide, and the bonding film 130 is famed of polysilicon. The gate pad layer 150 is formed by first depositing a Ti (titanium) layer 152 and a TiN (titanium nitride) layer 153 on the bonding film 130, as illustrated in FIG. 5, and then performing a heat treatment so that Si included in the bonding film 130 and the Ti layers 152 react. Hence, a TiSi alloy layer 154 is formed, as illustrated in FIG. 6. Thereafter, as illustrated in FIG. 7, an AlSiCu layer 155 is deposited on the TiN layer 153, so as to form the gate pad layer 150 in which the TiSi alloy layer 154, the TiN layer 153, and the AlSiCu layer 155 are successively laminated on the bonding film 130.

In other words, by performing the heat treatment at a temperature of approximately 700° C. after depositing the Ti layer 152 and the TiN layer 153 on the bonding film 130, the bonding film 130 formed of the polysilicon and Ti of the Ti layer 152 react, thereby forming the TiSi alloy layer 154. By forming the TiSi alloy layer 154 in this manner, it is possible to increase the adhesion of the bonding film 130 formed of the polysilicon and the gate pad layer 150. Hence, in the gate pad region 151, it is possible to prevent delamination of the gate pad layer 150 when wire bonding to the gate pad layer 150. The bonding film 130 may be formed of Al (aluminum) or the like, other than the polysilicon, however, polysilicon is preferable from a manufacturing viewpoint.

A thickness of the Ti layer 152 is approximately 10 nm, a thickness of the TiN layer 153 is 100 nm, and an overall thickness of the gate pad layer 150 is in a range of 3 μm to 5 μm. In addition, a metal film including Al may be used in place of the AlSiCu layer 155.

The TiN layer 153 of the gate pad layer 150 is provided to prevent Al included in the AlSiCu layer 155 from diffusing into the interlayer insulator 140. In other words, if the Al included in the AlSiCu layer 155 diffuses into the interlayer insulator 140, a resistance between the gate pad layer 150 and the source electrode layer 60 may decrease, and this, the TiN layer 153 is provided to prevent the diffusion and the decrease in the resistance.

Figure 8:
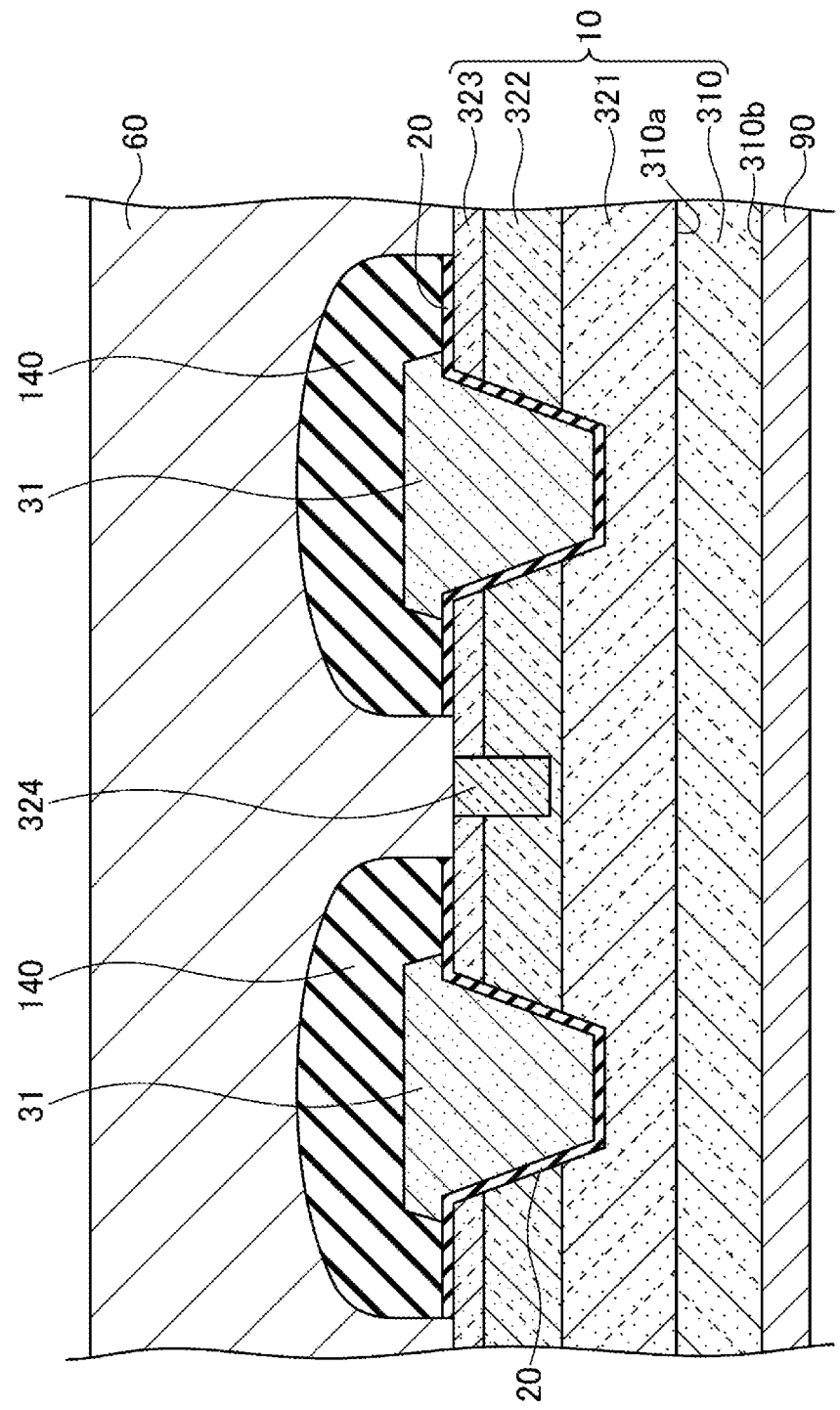
FIG. 8 is a diagram (1) for explaining the gate pad layer according to the first embodiment of the present disclosure.

The vertical transistor according to the present embodiment includes a first n-type layer 321, a p-type layer 322, and a second n-type layer 323 successively formed on a first principal surface 310a of a silicon carbide single crystal substrate 310, as illustrated in FIG. 8. The silicon carbide semiconductor substrate 10 is formed by the silicon carbide single crystal substrate 310, the first n-type layer 321, the p-type layer 322, the second n-type layer 323, or the like. In addition, a gate trench having a V-shaped cross section is formed by removing portions of the second n-type layer 323, the p-type layer 322, and the first n-type layer 321. A bottom surface and sidewalls of the gate trench are covered by the gate insulator 20, and the inside of the gate trench is filled with polysilicon deposited on the gate insulator 20, thereby forming a gate electrode 31. The gate electrode 31 is connected to the gate interconnect layer 30.

In addition, the interlayer insulator 140 is formed, so as to cover the gate electrode 31. A highly doped p-type region 324, having a high impurity concentration, is formed in a region separated from the gate trenches by ion implantation of a p-type impurity element. The source electrode layer 60 is famed on the interlayer insulator 140, the second n-type layer 323, and the highly doped p-type region 324, and the drain electrode 90 is formed on a second principal surface 310b of the silicon carbide single crystal substrate 310 opposite to the first principal surface 310a. Such a vertical transistor is formed in the region where the source electrode layer 60 is formed.

The first n-type layer 321 is an n-type drift layer, doped with an n-type impurity element, and having a relatively low impurity concentration. The p-type layer 322 is a p-type body layer, doped with an impurity element which becomes the p-type. The second n-type layer 323 is an n-type layer, doped with an impurity element which becomes the n-type, and having an impurity concentration higher than that of the first n-type layer 321.

In the vertical transistor having the structure illustrated in FIG. 8, when a predetermined voltage is applied to the gate electrode 31, a channel is famed in a region of the p-type layer 322 near the gate insulator 20, thereby forming an electrical connecting between the first n-type layer 321 and the second n-type layer 323. Hence, a current flows between the source electrode layer 60 and the drain electrode 90, thereby turning on the semiconductor device. When the predetermined voltage is not applied to the gate electrode 31, no channel is formed in the p-type layer 322, no current flows between the source electrode layer 60 and the drain electrode 90, and the semiconductor device is in an off state.

(Method for Manufacturing Silicon Carbide Semiconductor Device)

Next, a method for manufacturing the silicon carbide semiconductor device according to the present embodiment will be described, with reference to FIG. 9 through FIG. 14. In the following description of the manufacturing method, the process related to the portion where the gate pad layer 150 is famed, will mainly be described, and the processes related to the ion implantation of the impurity element, forming the gate trench, or the like, will be omitted.

Figure 9:
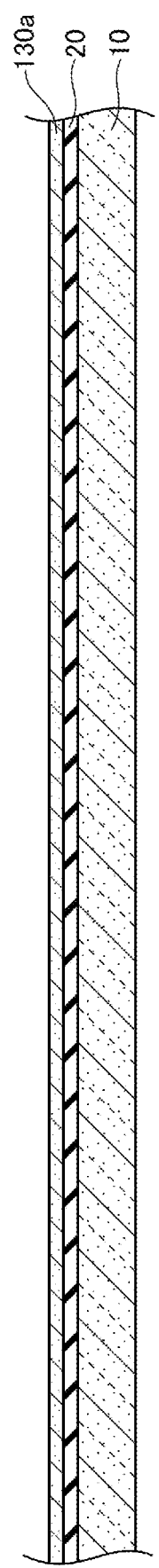
FIG. 9 is a process chart (1) of a method for manufacturing the silicon carbide semiconductor device according to the first embodiment of the present disclosure.

First, as illustrated in FIG. 9, the gate insulator 20 and a polysilicon film 130a are successively formed on the silicon carbide semiconductor substrate 10 already subjected to the ion implantation of the impurity element or the like. The gate insulator 20 is formed by thermal oxidation of the surface of the silicon carbide semiconductor substrate 10, so as to form a silicon oxide film having a thickness of approximately 50 nm. Thereafter, the polysilicon film 130a having a thickness of approximately 300 nm is deposited on the gate insulator 20 by CVD (chemical vapor deposition). The gate electrode 31, the gate interconnect layer 30, and the bonding film 130, which will be described later, are formed using the polysilicon film 130a famed in this manner.

Figure 10:
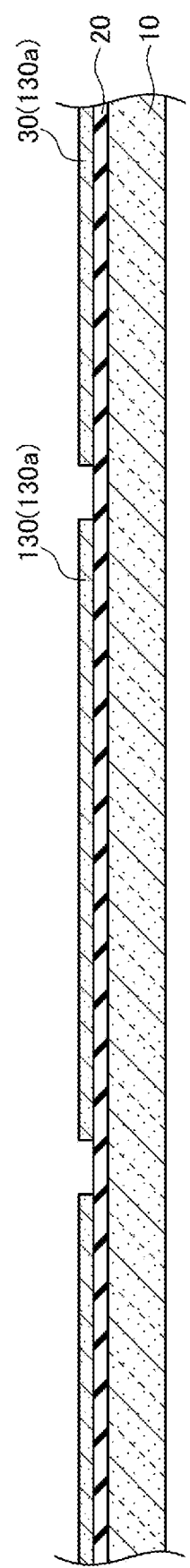
FIG. 10 is a process chart (2) of the method for manufacturing the silicon carbide semiconductor device according to the first embodiment of the present disclosure.

Next, a resist pattern which is not illustrated is formed on the polysilicon film 130a, and portions of the polysilicon film 130a are removed, to form the gate interconnect layer 30, the bonding film 130, or the like by the remaining polysilicon film 130a, as illustrated in FIG. 10. More particularly, a photoresist is coated on the polysilicon film 130a, and an exposure by an exposure apparatus and a developing are performed, to form the resist pattern, not illustrated, having an opening in a region where the polysilicon film 130a is to be removed. Thereafter, the polysilicon film 130a at the opening of the resist pattern is removed by RIE (Reactive Ion Etching) or the like, to form the gate interconnect layer 30, the bonding film 130, or the like by the remaining polysilicon film 130a. Then, the resist pattern which is not illustrated is removed using an organic solvent or the like.

Figure 11:
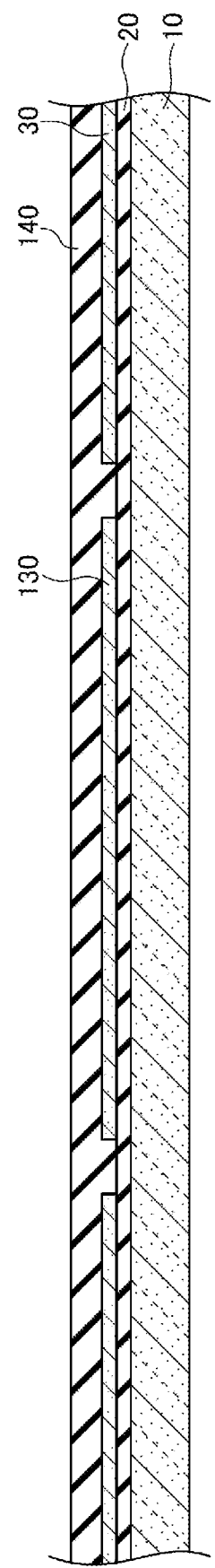
FIG. 11 is a process chart (3) of the method for manufacturing the silicon carbide semiconductor device according to the first embodiment of the present disclosure.

Next, as illustrated in FIG. 11, the interlayer insulator 140 is formed on the gate interconnect layer 30, the bonding film 130, or the like. The interlayer insulator 140 is formed by depositing silicon oxide by CVD.

Figure 12:
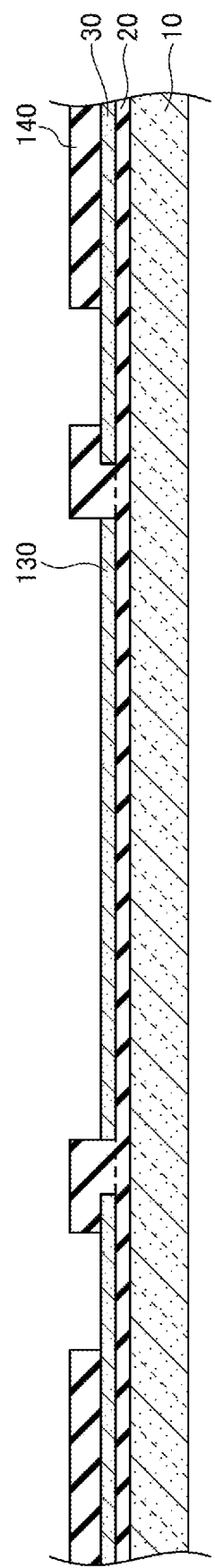
FIG. 12 is a process chart (4) of the method for manufacturing the silicon carbide semiconductor device according to the first embodiment of the present disclosure.

Next, as illustrated in FIG. 12, a portion of the interlayer insulator 140 is removed, to expose a portion of the gate interconnect layer 30, and the bonding film 130. More particularly, a photoresist is coated on the interlayer insulator 140, and an exposure by the exposure apparatus and a developing are performed, to form a resist pattern, not illustrated, having an opening. Thereafter, the interlayer insulator 140 at the opening of the resist pattern is removed by RIE or the like, to expose a portion of the gate interconnect layer 30, and the bonding film 130. the resist pattern which is not illustrated is removed using an organic solvent or the like.

Figure 13:
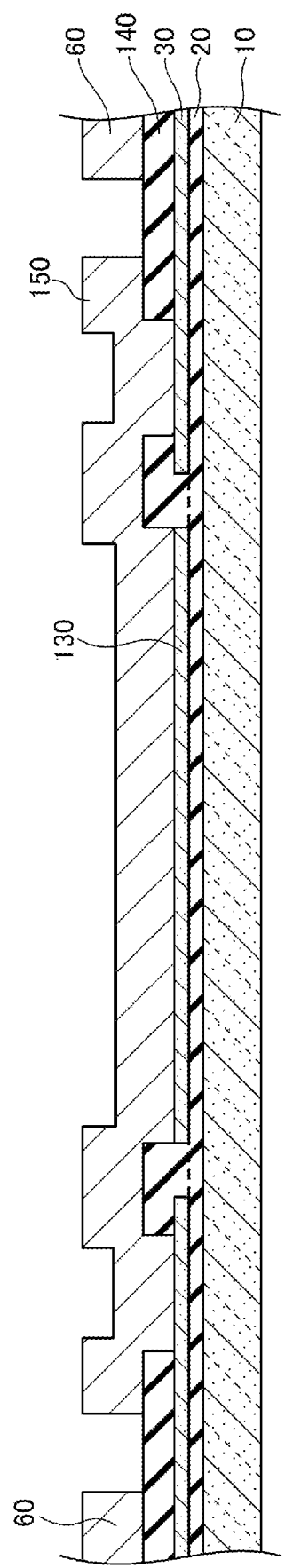
FIG. 13 is a process chart (5) of the method for manufacturing the silicon carbide semiconductor device according to the first embodiment of the present disclosure.

Next, as illustrated in FIG. 13, the gate pad layer 150 and the source electrode layer 60 are formed. More particularly, a film formed by successively depositing and laminating a Ti layer and a TiN layer by sputtering, is formed on the exposed gate interconnect layer 30, bonding film 130, and interlayer insulator 140. A thickness of the deposited Ti layer is 10 nm, and a thickness of the deposited TiN layer is 100 nm. Thereafter, by performing a heat treatment at a temperature of approximately 700° C., the Si included in the gate interconnect layer 30 and the bonding film 130 are caused to react with the Ti included in the Ti layer, to form a TiSi alloy layer. Then, an AlSiCu layer is deposited on the TiN layer by sputtering, to form a laminated metal film in which the TiSi alloy layer which is an alloy layer including Ti, the TiN layer, and the AlSiCu layer are successively deposited. Thereafter, a resist pattern, which is not illustrated, is formed on the laminated metal film. The resist pattern is formed in regions where the gate pad layer 150 and the source electrode layer 60 are to be famed, and the gate pad layer 150 and the source electrode layer 60 are famed by removing the laminated metal film at the openings of the resist pattern by etching.

Figure 14:
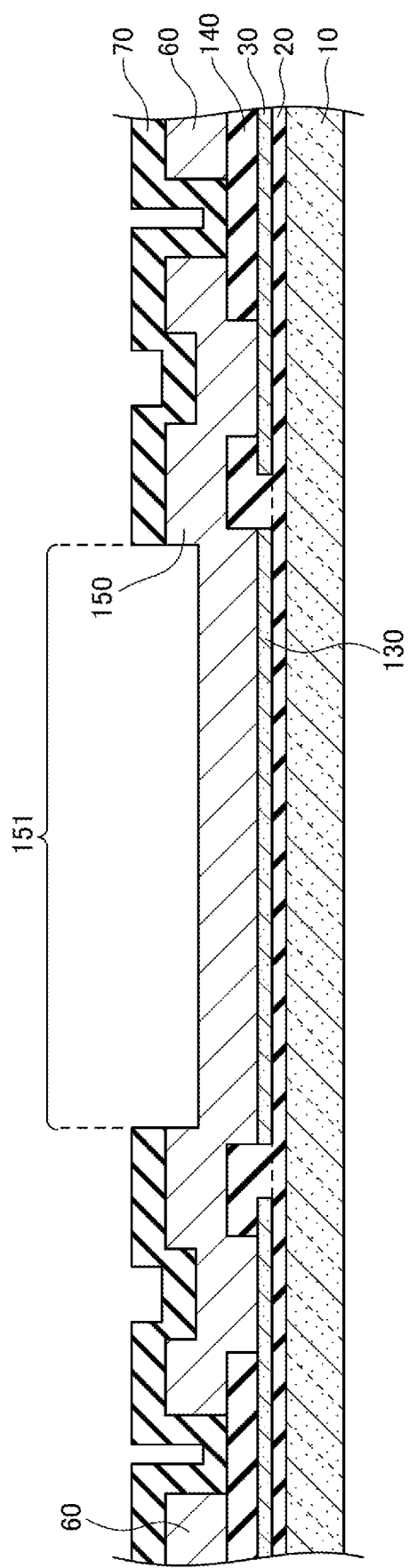
FIG. 14 is a process chart (6) of the method for manufacturing the silicon carbide semiconductor device according to the first embodiment of the present disclosure.

Next, as illustrated in FIG. 14, the passivation film 70 is deposited using SiN, and portions of the passivation film 70 are removed to form the gate pad region 151 and the source pad region 61. More particularly, a SiN film having a thickness of approximately 1 μm is formed on the gate pad layer 150, the source electrode layer 60, or the like by CVD. Thereafter, a photoresist is coated on the deposited SiN film, and an exposure by the exposure apparatus and a developing are performed, to form a resist pattern, not illustrated, having openings in regions where the gate pad region 151 and the source pad region 61 are to be formed. Then, the SiN film at the opening of the resist pattern is removed by RIE or the like, the passivation film 70 is formed by the remaining SiN film. Hence, in the gate pad layer 150, the gate pad region 151 is formed in the region where the passivation film 70 is open, and in the source electrode layer 60, the source pad region 61 is formed in a region where the passivation film 70 is open.

The silicon carbide semiconductor device according to the present embodiment can be manufactured by the processes described above.

In the example described above, the silicon carbide semiconductor is used, however, the present disclosure is similarly applicable to a semiconductor device using a silicon substrate, a GaAs substrate, or the like.

Second Embodiment

Figure 15:
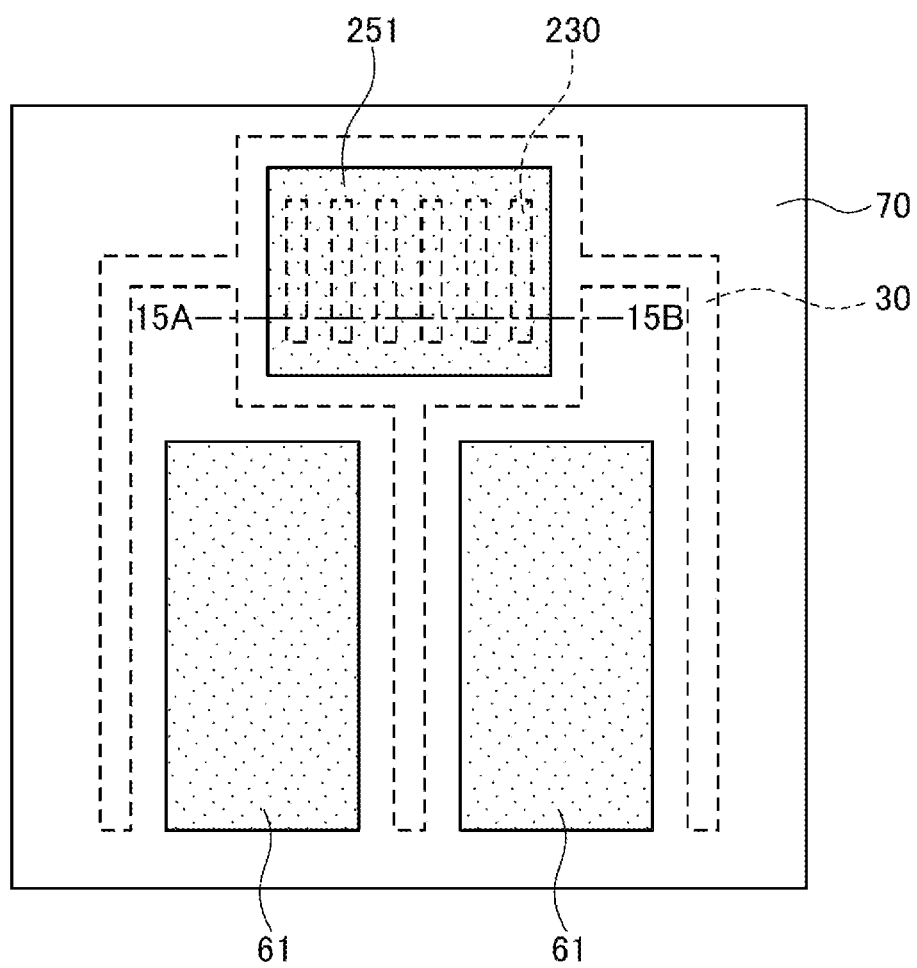
FIG. 15 is a top view of the silicon carbide semiconductor device according to a second embodiment of the present disclosure.
Figure 16:
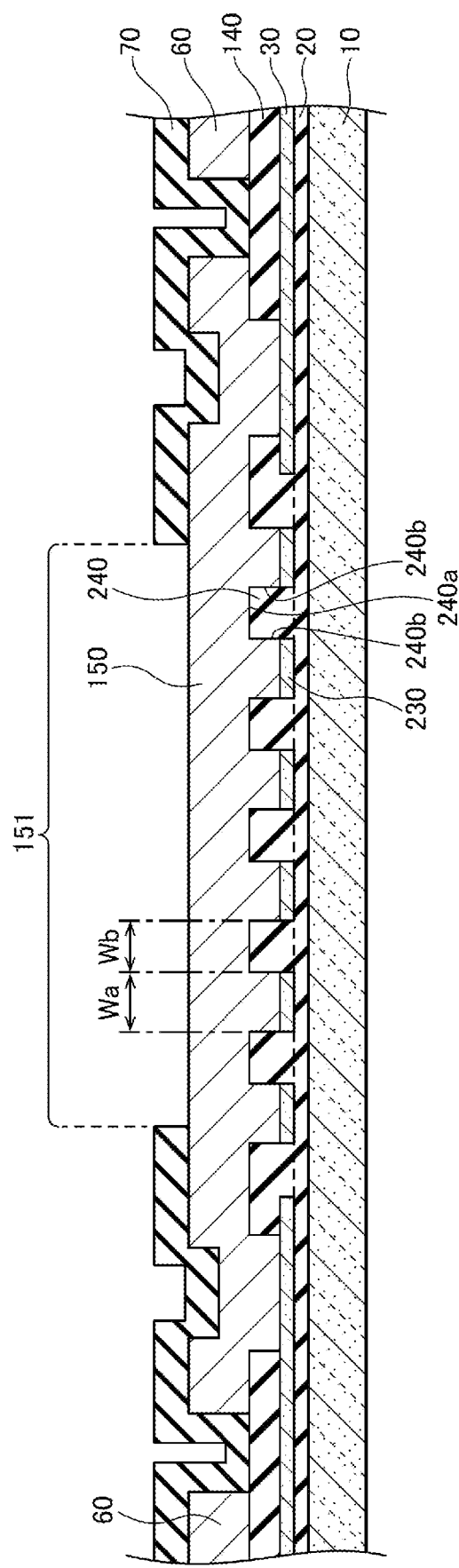
FIG. 16 is a cross sectional view of the silicon carbide semiconductor device according to the second embodiment of the present disclosure.

Next, the silicon carbide semiconductor device, which becomes the vertical transistor according to a second embodiment, will be described with reference to FIG. 15 and FIG. 16. FIG. 15 is a top view of the silicon carbide semiconductor device according to the present embodiment, and FIG. 16 is a cross sectional view cut along a one-dot chain line 15A-15B in FIG. 15.

The silicon carbide semiconductor device according to the present embodiment is the so-called vertical silicon carbide semiconductor device, and includes the gate insulator 20 formed on the silicon carbide semiconductor substrate 10, and the gate interconnect layer 30 and a bonding film 230 formed on the gate insulator 20. In the present embodiment, the bonding film 230 is formed to a stripe shape in a top view with respect to a substrate surface of the silicon carbide semiconductor substrate 10, and a convex portion 240 made of silicon oxide is famed between the stripes of the stripe shaped bonding film 230. The interlayer insulator 140 has an opening at a portion where the gate interconnect layer 30 and the gate pad layer 150 are connected, and the gate pad layer 150 is connected to the gate interconnect layer 30 via the opening of the interlayer insulator 140.

In the present embodiment, the convex portion 240 is formed simultaneously as the interlayer insulator 140. The gate pad layer 150 is formed on the bonding film 230 and the convex portion 240 in a region including the gate pad region 151, and the source electrode layer 60 is formed on both sides of the gate pad layer 150. In the present embodiment, the gate pad layer 150 makes contact with a top surface 240a and a side surface 240b of the convex portion 240.

The interlayer insulator 140 and the convex portion 240 are formed of silicon oxide, which is an insulator, and the bonding film 230 is formed of polysilicon.

In the present embodiment, after a Ti layer and a TiN layer are deposited on the bonding film 230 and the convex portion 240, a heat treatment is performed at a temperature of approximately 700° C. Hence, the bonding film 230 formed of polysilicon reacts with Ti of the Ti layer on the bonding film 230, to form a TiSi alloy layer. Moreover, in the present embodiment, the top surface 240a and the side surface 240b of the convex portion 240 make contact with the gate pad layer 150, a contact area between the convex portion 240 the gate pad layer 150 is large. For this reason, the adhesion of the bonding film 230 and the convex portion 240 to the gate pad layer 150 becomes even higher than in the first embodiment. As a result, it is possible to prevent the delamination of the gate pad layer 150, when making the connection by wire bonding the gate pad layer 150 in the gate pad region 151.

In the present embodiment, the bonding film 230 and the convex portion 240 are alternately formed, and for example, a width Wa of the bonding film 230 is approximately 10 μm, and a width Wb of the convex portion 240 is approximately 10 μm. The width Wa of the bonding film 230 is preferably in a range greater than or equal to 0.5 μm and less than or equal to 100 μm. Further, the width Wb of the convex portion 240, which is a spacing between the adjacent bonding films, is preferably in a range greater than or equal to 0.5 μm and less than or equal to 100 μm. In the present embodiment, the width Wb of the convex portion 240 is a minimum spacing between the bonding film 230 and the bonding film 230 which are adjacent to each other.

From a viewpoint of an accuracy of finishing of the general photolithography, the widths Wa and Wb are preferably greater than or equal to 0.5 μm. In addition, when the width Wa is less than or equal to 100 μm, the number of cycles is not significantly reduced, and the anchor effect is not reduced thereby. When the width Wb is less than or equal to 100 μm, it is possible to secure a sufficiently large area of the bonding film 230.

In addition, an area of the bonding film 230 inside the gate pad region 151 is preferably in a range greater than or equal to 5% and less than or equal to 95% of an area of the gate pad region 151, and more preferably in a range greater than or equal to 50% and less than or equal to 80% of the area of the gate pad region 151. The gate pad region 151 has a square shape with a side of approximately 100 μm, for example. The effect of improving the adhesion is small when the area of the bonding film 230 is less than 5% of the area of the gate pad region 151, and the anchor effect is small when the area of the bonding film 230 is greater than 95% of the area of the gate pad region 151. Further, the effect of improving the adhesion by the bonding film 230, and the effect of improving the adhesion by the anchor effect, can both be sufficiently obtained when the area of the bonding film 230 is in the range greater than or equal to 50% and less than or equal to 80% of the area of the gate pad region 151.

(Method for Manufacturing Silicon Carbide Semiconductor Device)

Next, the method for manufacturing the silicon carbide semiconductor device according to the present embodiment will be described, with reference to FIG. 17 through FIG. 22.

Figure 17:
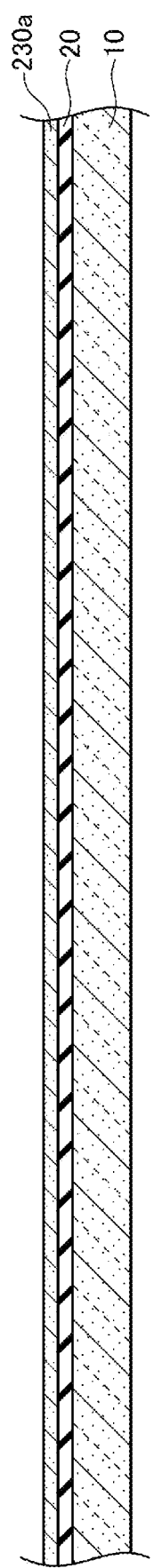
FIG. 17 is a process chart (1) of the method for manufacturing the silicon carbide semiconductor device according to the second embodiment of the present disclosure.

First, as illustrated in FIG. 17, the gate insulator 20 and a polysilicon film 230a are successively formed on the silicon carbide semiconductor substrate 10 already subjected to the ion implantation of the impurity element or the like.

Figure 18:
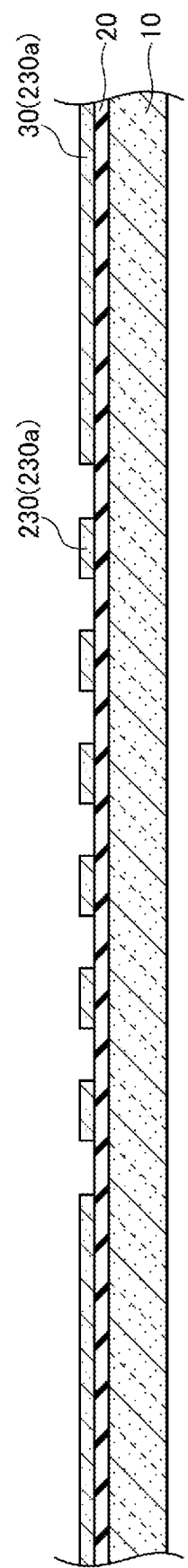
FIG. 18 is a process chart (2) of the method for manufacturing the silicon carbide semiconductor device according to the second embodiment of the present disclosure.

Next, by a resist pattern, not illustrated, is formed on the polysilicon film 230a, and portions of the polysilicon film 230a are removed, so as to form the gate interconnect layer 30, the bonding film 230, or the like by the remaining polysilicon film 230a, as illustrated in FIG. 18. More particularly, a photoresist is coated on the polysilicon film 230a, and an exposure by an exposure apparatus and a developing are performed, to form the resist pattern, not illustrated, having openings in regions where the polysilicon film 230a is to be removed. Thereafter, the polysilicon film 230a at the openings of the resist pattern is removed by RIE or the like. Then, the resist pattern which is not illustrated is removed using an organic solvent or the like. Hence, the bonding film 230 is formed to the stripe shape having a width of 10 μm and a spacing of 10 μm.

Figure 19:
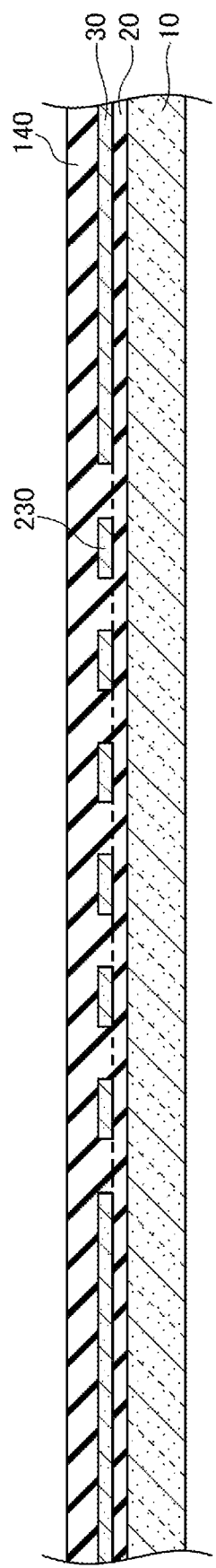
FIG. 19 is a process chart (3) of the method for manufacturing the silicon carbide semiconductor device according to the second embodiment of the present disclosure.

Next, as illustrated in FIG. 19, the interlayer insulator 140 is formed on the gate interconnect layer 30, the bonding film 230, or the like. The interlayer insulator 140 is formed by depositing silicon oxide by CVD.

Figure 20:
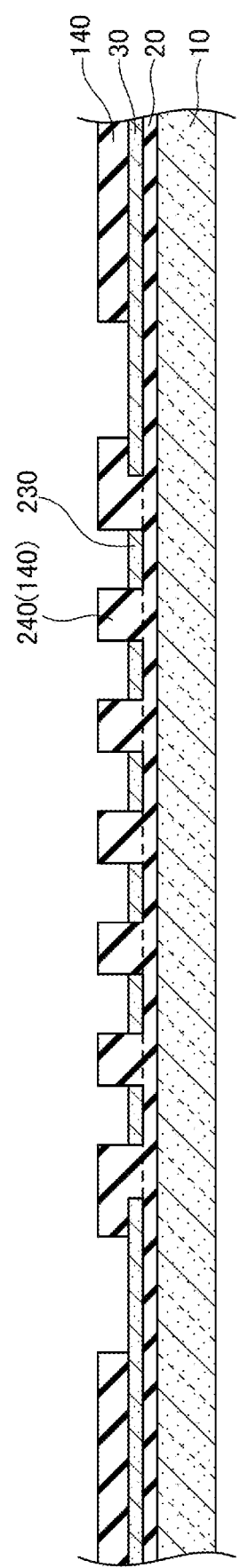
FIG. 20 is a process chart (4) of the method for manufacturing the silicon carbide semiconductor device according to the second embodiment of the present disclosure.

Next, as illustrated in FIG. 20, portions of the interlayer insulator 140 are removed to expose a portion of the gate interconnect layer 30 and the bonding film 230. Hence, the convex portion 240 is formed by the interlayer insulator 140 remaining between the bonding film 230 and the bonding film 230 which are adjacent to each other.

Figure 21:
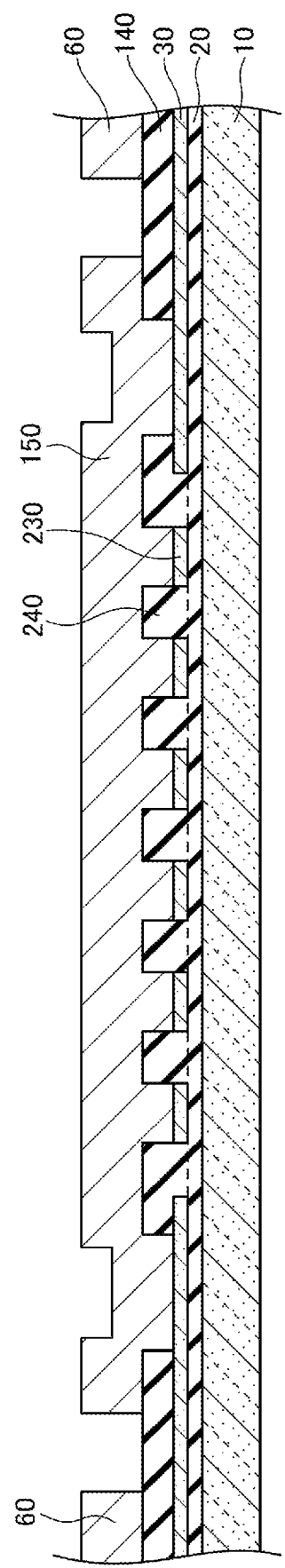
FIG. 21 is a process chart (5) of the method for manufacturing the silicon carbide semiconductor device according to the second embodiment of the present disclosure.

Next, as illustrated in FIG. 21, the gate pad layer 150 and the source electrode layer 60 are famed. More particularly, a film formed by successively depositing and laminating a Ti layer and a TiN layer by sputtering, is famed on the exposed gate interconnect layer 30, bonding film 230, interlayer insulator 140, and convex portion 240. A thickness of the deposited TiN layer is 10 nm, and a thickness of the deposited TiN layer is 100 nm. Thereafter, by performing a heat treatment at a temperature of approximately 700° C., the Si included in the gate interconnect layer 30 and the bonding film 230 are caused to react with the Ti included in the Ti layer which makes contact with the gate interconnect layer 30 and the bonding film 230, to form a TiSi alloy layer. Thereafter, an AlSiCu layer is deposited on the TiN layer by sputtering, to form a laminated metal film in which the TiSi alloy layer which is an alloy layer including Ti, the TiN layer, and the AlSiCu layer are successively deposited. Then, a resist pattern which is not illustrated is formed on the laminated metal film. A resist pattern is formed in regions where the gate pad layer 150 and the source electrode layer 60 are to be famed, and the laminated metal film at openings of the resist pattern is removed to form the gate pad layer 150 and the source electrode layer 60.

Figure 22:
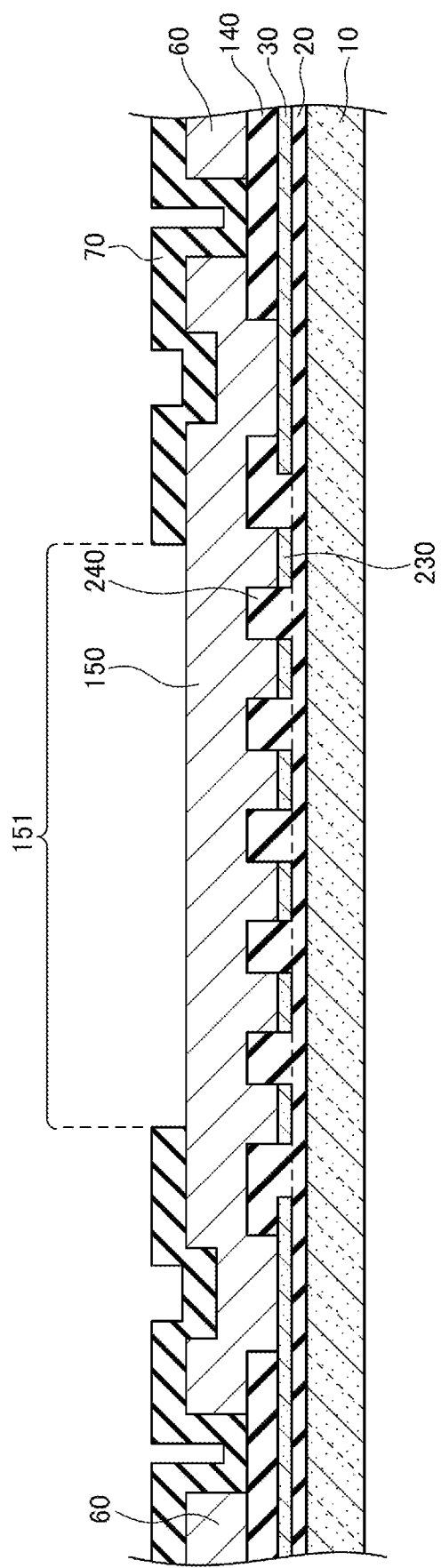
FIG. 22 is a process chart (6) of the method for manufacturing the silicon carbide semiconductor device according to the second embodiment of the present disclosure.

Next, as illustrated in FIG. 22, the passivation film 70 is formed by SiN, and portions of the passivation film 70 are removed to form the gate pad region 151 and the source pad region 61. Hence, in the gate pad layer 150, the gate pad region 151 is formed in a region where the passivation film 70 is open, and in the source electrode layer 60, the source pad region 61 is formed in a region where the passivation film 70 is open.

(Modification)

Figure 23:
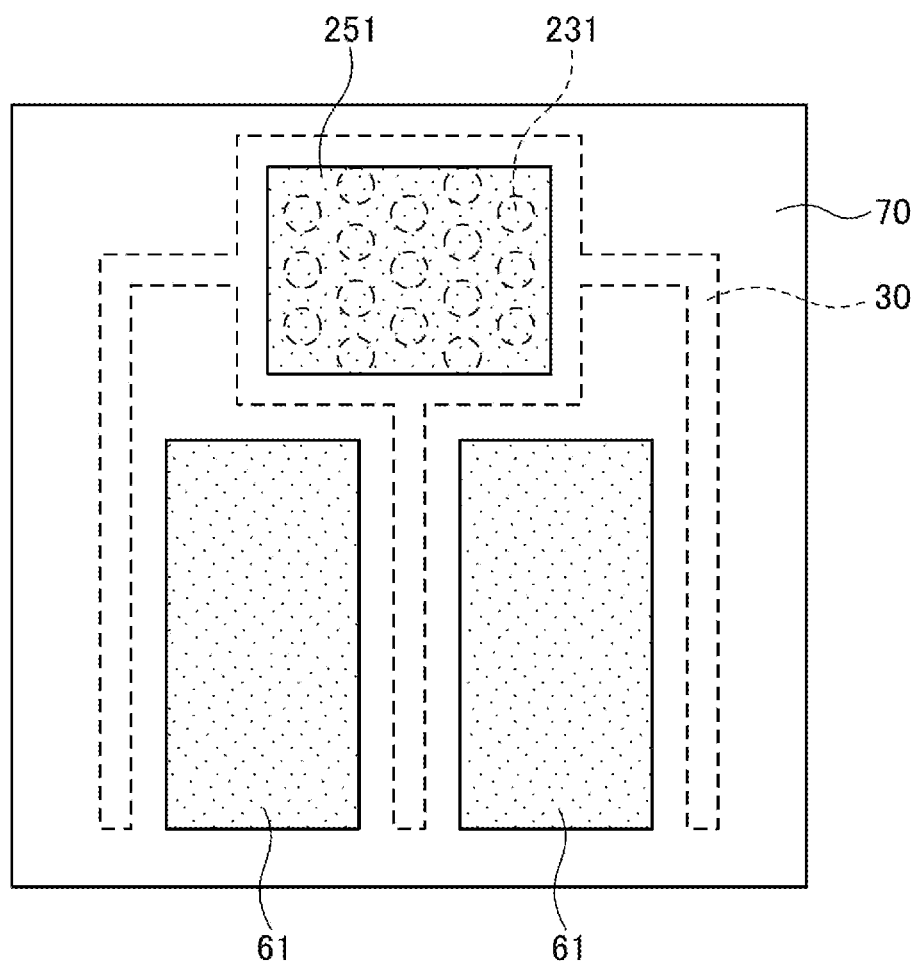
FIG. 23 is a top view of the silicon carbide semiconductor device according to a modification of the second embodiment of the present disclosure.

Further, in the present embodiment, as illustrated in FIG. 23, a bonding film 231 may be formed to a circular shape in the top view may be formed such that a shape viewed from the top with respect to the substrate surface. In this case, a convex portion is formed in portions of the gate pad region 151 not formed with the bonding film 231.

In this case, a diameter of the bonding film 231 is approximately 10 µm, and a minimum distance between the adjacent bonding films 231 is approximately 10 µm. The diameter of the bonding film 231 is preferably in a range greater than or equal to 0.5 µm and less than or equal to 100 µm. In addition, the minimum distance between the adjacent bonding films 231 is preferably in a range greater than or equal to 0.5 µm and less than or equal to 100 µm.

The bonding film 231 may have a polygonal shape, such as a triangular shape, a rectangular shape, or the like in the top view with respect to the substrate surface.

The present embodiment is otherwise the same as the first embodiment.

Although the embodiments are described above in detail, the present disclosure is not limited to specific embodiments, and various variations and modifications may be made without departing from the scope of the appended claims.

DESCRIPTION OF REFERENCE NUMERALS

10 Silicon carbide semiconductor substrate
20 Gate insulator
30 Gate interconnect layer
31 Gate electrode
40 Interlayer insulator
50 Gate pad layer
51 Gate pad region
60 Source electrode layer
61 Source pad region
70 Passivation film
90 Drain electrode
130 Bonding film
130a Polysilicon film
140 Interlayer insulator
150 Gate pad layer
151 Gate pad region
152 Ti layer
153 TiN layer
154 TiSi alloy layer
155 AlSiCu layer
230 Bonding film
230a Polysilicon film
231 Bonding film
240 Convex portion
240a Top surface
240b Side Surface
310 Silicon carbide single crystal substrate
310a First principal surface
310b Second principal surface
321 First n-type layer
322 P-type layer
323 Second n-type layer
324 High-concentration p-type region

The invention claimed is:

1. A semiconductor device comprising:
a semiconductor substrate;
a gate insulator provided on a surface of the semiconductor substrate;
a plurality of convex portions, formed of an insulator, and provided on and in direct contact with the gate insulator;
a bonding film, including silicon or aluminum, provided on the gate insulator; and
a gate pad layer provided above the bonding film,
wherein the gate pad layer includes titanium in at least a region in contact with the bonding film, and
the bonding film is provided between adjacent convex portions of the plurality of convex portions.

2. The semiconductor device as claimed in claim 1, wherein the bonding film has one of a stripe shape, a circular shape, and a polygonal shape in a top view.

3. The semiconductor device as claimed in claim 1, wherein a spacing between adjacent bonding films is in a range greater than or equal to 0.5 µm and less than or equal to 100 µm.

4. The semiconductor device as claimed in claim 1, further comprising:
a passivation film provided on the gate pad layer; and
a gate pad region formed by a region of the gate pad layer exposed via an opening in the passivation film,
wherein an area of the bonding film with respect to an area of the gate pad region is in a range greater than or equal to 5% and less than or equal to 95%.

5. The semiconductor device as claimed in claim 1, further comprising:
a passivation film provided on the gate pad layer, and
a gate pad region formed by a region of the gate pad layer exposed via an opening in the passivation film,
wherein the bonding film and the gate pad layer are in contact with each other within the entire gate pad region.

6. The semiconductor device as claimed in claim 1, wherein the gate pad layer includes an alloy layer including titanium, a titanium nitride layer, and a metal layer including aluminum which are successively laminated from a side in contact with the bonding film.

7. The semiconductor device as claimed in claim 1, wherein the semiconductor substrate is a silicon carbide semiconductor substrate.

8. The semiconductor device as claimed in claim 1, wherein the bonding film is in direct contact with the gate insulator between the adjacent convex portions of the plurality of convex portions.

9. A semiconductor device comprising:
a semiconductor substrate;
a gate insulator provided on a surface of the semiconductor substrate;
a bonding film provided on the gate insulator and including silicon or aluminum;
a gate pad layer provided on the bonding film;
a plurality of convex portions made of an insulator and provided on the gate insulator:
a passivation film provided on the gate pad layer; and
a gate pad region formed by a region of the gate pad layer exposed via an opening in the passivation film,
wherein the gate pad layer includes titanium in at least a region making contact with the bonding film,
the bonding film is provided between adjacent convex portions of the plurality of convex portions,
the bonding film has one of a stripe shape, a circular shape, and a polygonal shape in a top view, a spacing between adjacent bonding films is in a range greater than or equal to 0.5 μm and less than or equal to 100 μm, and an area of the bonding film with respect to an area of the gate pad region is in a range greater than or equal to 5% and less than or equal to 95%.

10. The semiconductor device as claimed in claim 9, wherein the gate pad layer includes an alloy layer including titanium, a titanium nitride layer, and a metal layer including aluminum which are successively laminated from a side in contact with the bonding film.

11. The semiconductor device as claimed in claim 9, wherein the semiconductor substrate is a silicon carbide semiconductor substrate.

12. The semiconductor device as claimed in claim 9, further comprising:

a plurality of convex portions, formed of an insulator, and provided on and in direct contact with the gate insulator, wherein the bonding film is provided between adjacent convex portions of the plurality of convex portions.

13. The semiconductor device as claimed in claim 12, wherein the bonding film is in direct contact with the gate insulator between the adjacent convex portions of the plurality of convex portions.

14. A semiconductor device comprising:

a silicon carbide semiconductor substrate;

a gate insulator provided on a surface of the silicon carbide semiconductor substrate;

a bonding film provided on the gate insulator and including silicon or aluminum;

a gate pad layer provided on the bonding film;

a plurality of convex portions made of an insulator and provided on the gate insulator;

a passivation film provided on the gate pad layer; and a gate pad region formed by a region of the gate pad layer exposed via an opening in the passivation film, wherein the gate pad layer includes titanium in at least a region making contact with the bonding film, the bonding film is provided between adjacent convex portions of the plurality of convex portions, the bonding film has one of a stripe shape, a circular shape, and a polygonal shape in a top view, a spacing between adjacent bonding films is in a range greater than or equal to 0.5 μm and less than or equal to 100 μm, an area of the bonding film with respect to an area of the gate pad region is in a range greater than or equal to 5% and less than or equal to 95%, and the gate pad layer includes an alloy layer including titanium, a titanium nitride layer, and a metal layer including aluminum which are successively laminated from a side in contact with the bonding film.

15. The semiconductor device as claimed in claim 14, wherein the gate pad layer includes an alloy layer including titanium, a titanium nitride layer, and a metal layer including aluminum which are successively laminated from a side in contact with the bonding film.

16. The semiconductor device as claimed in claim 14, wherein the semiconductor substrate is a silicon carbide semiconductor substrate.

17. The semiconductor device as claimed in claim 14, further comprising:

a plurality of convex portions, formed of an insulator, and provided on and in direct contact with the gate insulator, wherein the bonding film is provided between adjacent convex portions of the plurality of convex portions.

18. The semiconductor device as claimed in claim 17, wherein the bonding film is in direct contact with the gate insulator between the adjacent convex portions of the plurality of convex portions.

\* \* \* \* \*